(12) United States Patent
Boisnier et al.

(10) Patent No.: US 11,910,547 B2
(45) Date of Patent: Feb. 20, 2024

(54) PROTECTION DEVICE FOR ELECTRICAL CABINET IN AIRCRAFT

(71) Applicant: SAFRAN ELECTRICAL & POWER, Blagnac (FR)

(72) Inventors: Benjamin Boisnier, Moissy-Cramayel (FR); Loïc Lemasson, Moissy-Cramayel (FR); Philippe Pierre Avignon, Moissy-Cramayel (FR)

(73) Assignee: SAFRAN ELECTRICAL & POWER, Blagnac (FR)

( * ) Notice: Subject to any disclaimer, the term of this patent is extended or adjusted under 35 U.S.C. 154(b) by 344 days.

(21) Appl. No.: 17/421,931

(22) PCT Filed: Jan. 14, 2020

(86) PCT No.: PCT/FR2020/050037
§ 371 (c)(1),
(2) Date: Jul. 9, 2021

(87) PCT Pub. No.: WO2020/148496
PCT Pub. Date: Jul. 23, 2020

(65) Prior Publication Data
US 2022/0117097 A1    Apr. 14, 2022

(30) Foreign Application Priority Data
Jan. 15, 2019 (FR) ...................................... 1900371

(51) Int. Cl.
*H05K 5/02* (2006.01)
*B64D 13/00* (2006.01)

(52) U.S. Cl.
CPC ........... *H05K 5/0213* (2013.01); *B64D 13/00* (2013.01)

(58) Field of Classification Search
None
See application file for complete search history.

(56) References Cited

U.S. PATENT DOCUMENTS 3,630,138 A * 12/1971 Marcussen ............. B64D 13/00
454/71
3,687,054 A * 8/1972 Boberg .................. B64D 13/00
454/76

(Continued)

FOREIGN PATENT DOCUMENTS

| CA | 2992857 A1 * | 7/2018 | ............ B64D 13/04 |
| CN | 104837320 A * | 8/2015 | |

(Continued)

OTHER PUBLICATIONS

Chinese_First_Office_Action_Translated (Year: 2022).*

(Continued)

*Primary Examiner* — Timothy J. Dole
*Assistant Examiner* — Muhammed Azam
(74) *Attorney, Agent, or Firm* — Pearne & Gordon LLP

(57) ABSTRACT

A protection device for an electrical cabinet is divided into a plurality of compartments, the protection device including a rain guard and an air manifold formed as an integral unit. The rain guard is designed to cover a section of an electrical cabinet and thus prevent water from falling on it. The air manifold includes at least one first pipe fluidically connected to a second pipe. Each first pipe intended to be connected to a corresponding air-circulation opening of a compartment, and the second pipe being intended to be connected to an air-circulation means in order thus to allow air to be circulated in the plurality of compartments. A cabinet is provided with such a protection device.

7 Claims, 2 Drawing Sheets

(56) References Cited

U.S. PATENT DOCUMENTS

| | | | | | |
|---|---|---|---|---|---|
| 3,848,662 | A | * | 11/1974 | Kilgore | F24D 9/00 165/122 |
| 3,987,258 | A | * | 10/1976 | Tsutsui | H05K 5/0213 181/149 |
| 5,010,777 | A | * | 4/1991 | Yehl | B60H 3/00 361/231 |
| 5,254,380 | A | * | 10/1993 | Salyer | F16D 66/00 126/246 |
| 6,430,044 | B2 | * | 8/2002 | Hutchinson | H05K 7/20563 455/128 |
| 10,601,166 | B2 | * | 3/2020 | Tchaaouaou | H01R 13/518 |
| 2005/0152116 | A1 | * | 7/2005 | McClary | H05K 7/20009 165/80.4 |
| 2009/0298408 | A1 | * | 12/2009 | Reisbach | B64D 13/00 454/76 |
| 2011/0127379 | A1 | | 6/2011 | Jager et al. | |
| 2011/0259546 | A1 | * | 10/2011 | DeFrancesco | B64D 13/00 137/861 |
| 2016/0325841 | A1 | * | 11/2016 | Beckman | B60H 1/00564 |
| 2017/0064863 | A1 | * | 3/2017 | Zeng | H02B 13/025 |
| 2017/0067663 | A1 | * | 3/2017 | Barna | H05K 5/0212 |
| 2018/0249595 | A1 | * | 8/2018 | Ashbaugh | H05K 7/206 |
| 2022/0037862 | A1 | | 2/2022 | Boisnier et al. | |

FOREIGN PATENT DOCUMENTS

| | | | | | |
|---|---|---|---|---|---|
| CN | 105633968 | A | * | 6/2016 | |
| CN | 105792572 | A | * | 7/2016 | B08B 1/002 |
| CN | 105960125 | A | * | 9/2016 | H05K 5/0213 |
| CN | 205566963 | U | * | 9/2016 | |
| CN | 106304722 | A | * | 1/2017 | H05K 5/0213 |
| CN | 206657980 | U | | 11/2017 | |
| CN | 107454771 | A | * | 12/2017 | |
| CN | 107454784 | A | * | 12/2017 | |
| CN | 107466180 | A | * | 12/2017 | H05K 5/0213 |
| CN | 107517574 | A | * | 12/2017 | H05K 5/0213 |
| CN | 105979755 | B | * | 1/2018 | |
| CN | 107700520 | A | * | 2/2018 | C22C 1/026 |
| CN | 107995820 | A | * | 5/2018 | |
| CN | 207611253 | U | | 7/2018 | |
| CN | 108513499 | A | * | 9/2018 | H05K 5/0213 |
| CN | 108601263 | A | * | 9/2018 | H05K 5/0213 |
| CN | 108668489 | A | * | 10/2018 | B08B 5/04 |
| CN | 108923404 | A | * | 11/2018 | |
| CN | 109120413 | A | * | 1/2019 | H04L 12/02 |
| CN | 109246953 | A | * | 1/2019 | |
| CN | 109451697 | A | * | 3/2019 | |
| CN | 110312385 | A | * | 10/2019 | |
| CN | 111246714 | A | * | 6/2020 | |
| CN | 111372406 | A | * | 7/2020 | |
| CN | 111384670 | A | * | 7/2020 | |
| DE | 29605555 | U1 | | 8/1996 | |
| DE | 10333353 | A1 | | 2/2005 | |
| DE | 10015570 | B4 | * | 11/2007 | B64D 13/00 |
| DE | 102010014354 | B4 | * | 5/2019 | B64D 13/00 |
| EP | 0380037 | A2 | * | 1/1990 | |
| EP | 2193700 | B1 | * | 7/2016 | F04D 29/703 |
| EP | 3547811 | A1 | * | 10/2019 | B01D 46/0043 |
| FR | 2410936 | A1 | | 6/1979 | |
| FR | 3047358 | A1 | | 8/2017 | |
| FR | 3091800 | A1 | * | 7/2020 | B64D 13/00 |
| GB | 906449 | A | * | 9/1962 | |
| IT | 1035146 | B | * | 10/1979 | B64D 13/00 |
| JP | H1114776 | A | * | 1/1999 | |
| KR | 20060130365 | A | * | 12/2006 | |
| KR | 20180096889 | A | * | 8/2018 | |
| WO | WO-2005075049 | A1 | * | 8/2005 | H05K 5/0213 |
| WO | WO-2013007257 | A1 | * | 1/2013 | H05K 5/0213 |

OTHER PUBLICATIONS

First Office Action for corresponding Chinese application No. 202080009293.3 dated Sep. 28, 2022.
Search Report issued in French Patent Application No. 1900371 dated Oct. 22, 2019.
International Search Report for issued in Application No. PCT/FR2020/050037 dated Jun. 3, 2020.
Written Opinion for PCT/FR2020/050037 dated Jun. 3, 2020.
U.S. Appl. No. 17/415,950 entitled "Door Hinge for an Electrical Cabinet", filed Jun. 18, 2021.
U.S. Appl. No. 17/419,484 entitled "Electric Distribution Module Split Into Compartments by Partitions Having Channels for Ventilation and/or the Passage of Control Cables", filed Jun. 29, 2021.

* cited by examiner

PROTECTION DEVICE FOR ELECTRICAL CABINET IN AIRCRAFT

This is the National Stage of PCT international application PCT/FR2020/050037, filed on Jan. 14, 2020 entitled "PROTECTION DEVICE FOR ELECTRICAL CABINET", which claims the priority of French Patent Application No. 1900371 filed Jan. 15, 2019, both of which are incorporated herein by reference in their entirety.

TECHNICAL FIELD

The invention generally relates to a protection device for an electrical cabinet. More particularly, the protection device comprises an arrangement of a rain guard and of an air manifold to protect an electrical cabinet, intended mainly for facilitating the installation and saving space. The invention also relates to an electrical cabinet provided with such a protection device.

PRIOR ART

Current aircraft generally include many electrical/electronic cabinets. These electrical cabinets generate heat during their operation, and therefore need to be cooled. Given the high density of the components inside such a cabinet, the latter is divided into several compartments, each one cooled separately. The cooling is carried out by means of a manifold that fluidically connects the compartments to a pump to extract the air therefrom. This manifold is mounted on the cabinet and is connected to air-circulation openings that are typically provided on the upper portion of the cabinet.

Electrical cabinets such as mentioned hereinabove are present in a large number of zones of the aircraft. However, some of them such as the holds, are more vulnerable than others to humidity, condensation, and even water leaks that can stream over an electrical cabinet. This is obviously a substantial risk of deterioration of the components inside the cabinet, even a short circuit. In order to reduce this risk, a rain guard is mounted on the cabinet in such a way as to prevent water from falling on it. The rain guard and the air manifold are therefore part of a protection device that protects the electrical cabinet from water and from heat.

FIG. 1 shows an electrical cabinet 1 provided with a protection device 7 according to the prior art. It is observed that the rain guard 2 is installed above the manifold 3 that already protrudes at the top of the electrical cabinet 1, and consequently, the protection device takes up a lot of space in terms of height. Moreover, in order to support the rain guard and provide a separation with the manifold, in such a way that it does not rest on the latter, the rain guard has to be provided with spacers used as fastening feet on the cabinet. This installation is complicated to carry out in light of the limited space in the aircraft. What is more, this protection device includes many parts and is relatively heavy.

There is therefore a need for a protection device for an electrical cabinet that is reliable and easy to install, that takes up less space, is lighter and is designed with few parts.

DISCLOSURE OF THE INVENTION

The object of the present invention is consequently to remedy the needs and disadvantages mentioned hereinabove by proposing a protection device for an electrical cabinet divided into a plurality of compartments, the protection device comprising a rain guard and an air manifold formed as an integral unit, the rain guard comprising a panel adapted to cover a section of an electrical cabinet and thus prevent water from falling therein, and the air manifold comprising at least one first pipe fluidically connected, at a distal end, to a second pipe, each first pipe being intended for being connected, at its proximal end, to a corresponding air-circulation opening of a compartment of said plurality of compartments, and the second pipe being intended for being connected, to an air-circulation means to thus allow for the circulation of air in said plurality of compartments.

Preferably, each first pipe passes through the panel.

More preferably, the integral unit is carried out by moulding or by additive printing.

Advantageously, the protection device further comprises at least one collar arranged to connect each first pipe to the corresponding air-circulation opening.

Preferably, the collar comprises a sleeve to receive the first pipe and a flange around the sleeve arranged to be fastened on the top of the cabinet facing the air-circulation opening.

More preferably, each first pipe is provided with a sealing ring at its proximal end, intended for being interposed between the first pipe and the collar.

Advantageously, the panel includes bosses each comprising a hole to receive a screw to fasten the integral unit to an electrical cabinet.

The object of the present invention also proposes an electrical cabinet provided with a protection device such as described hereinabove, the electrical cabinet being divided into a plurality compartments and each compartment comprising at least one air-circulation opening, and the protection device being mounted on the top of the electrical cabinet, the panel of the rain guard covering at least one section of the electrical cabinet, and the first pipes being connected respectively to the air-circulation openings of said compartments and the second pipe being fluidically connected to an air-circulation means.

BRIEF DESCRIPTION OF THE DRAWINGS

Preferred embodiments of the invention, as non-limiting examples, are described in what follows, in reference to the accompanying drawings, wherein.

In all these figures, identical references can designate identical or similar elements. Furthermore, the different parts shown in the figures are not necessarily shown according to a uniform scale, in order to make the figures more legible.

DETAILED DISCLOSURE OF PARTICULAR EMBODIMENTS

Figure 1:
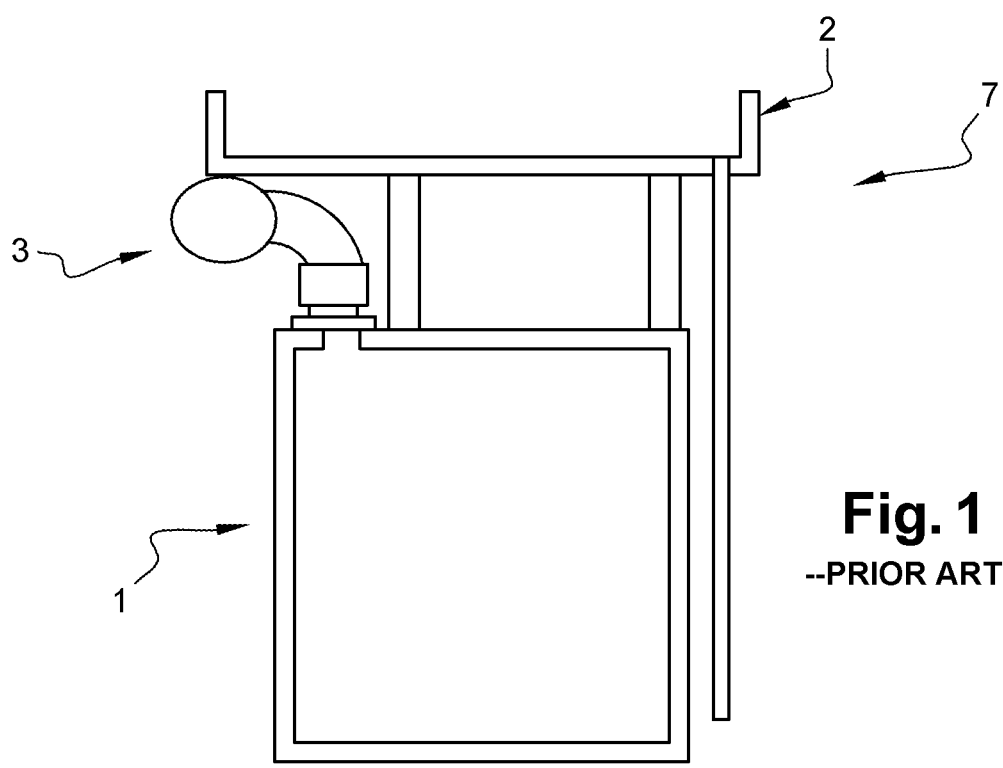
FIG. 1 shows a lateral schematic view of a cabinet provided with a protection device according to the prior art.
Figure 2:
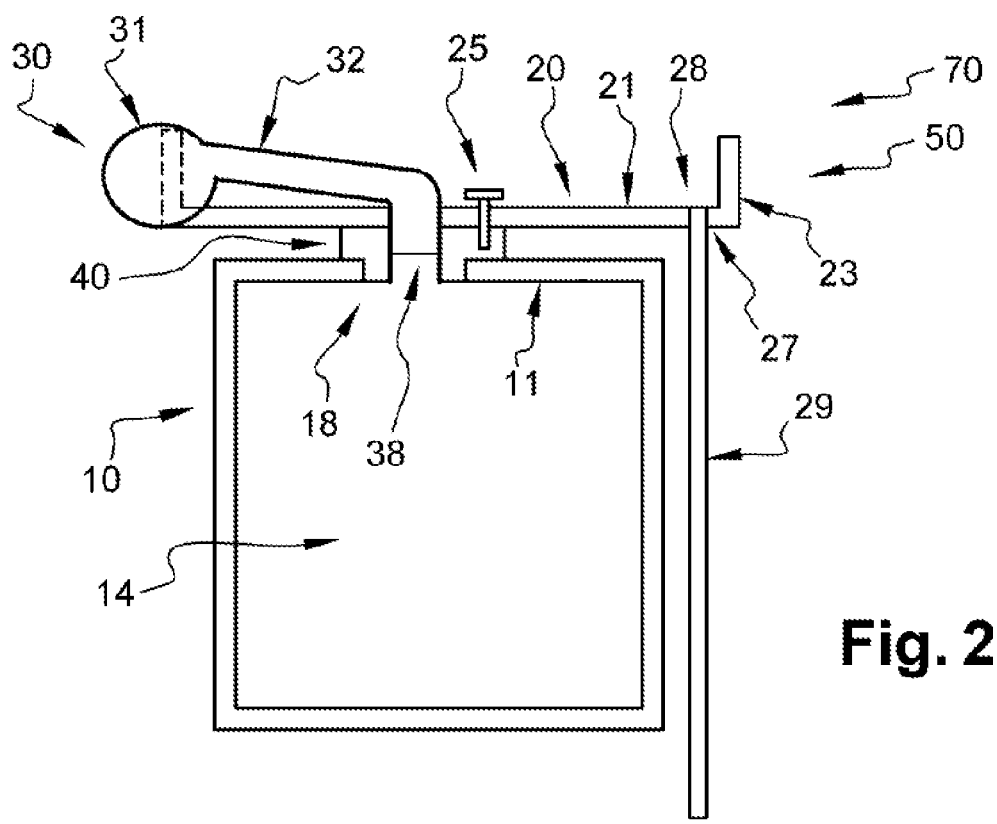
FIG. 2 shows a lateral schematic view of a cabinet provided with a protection device according to a preferred embodiment of the invention.
Figure 3:
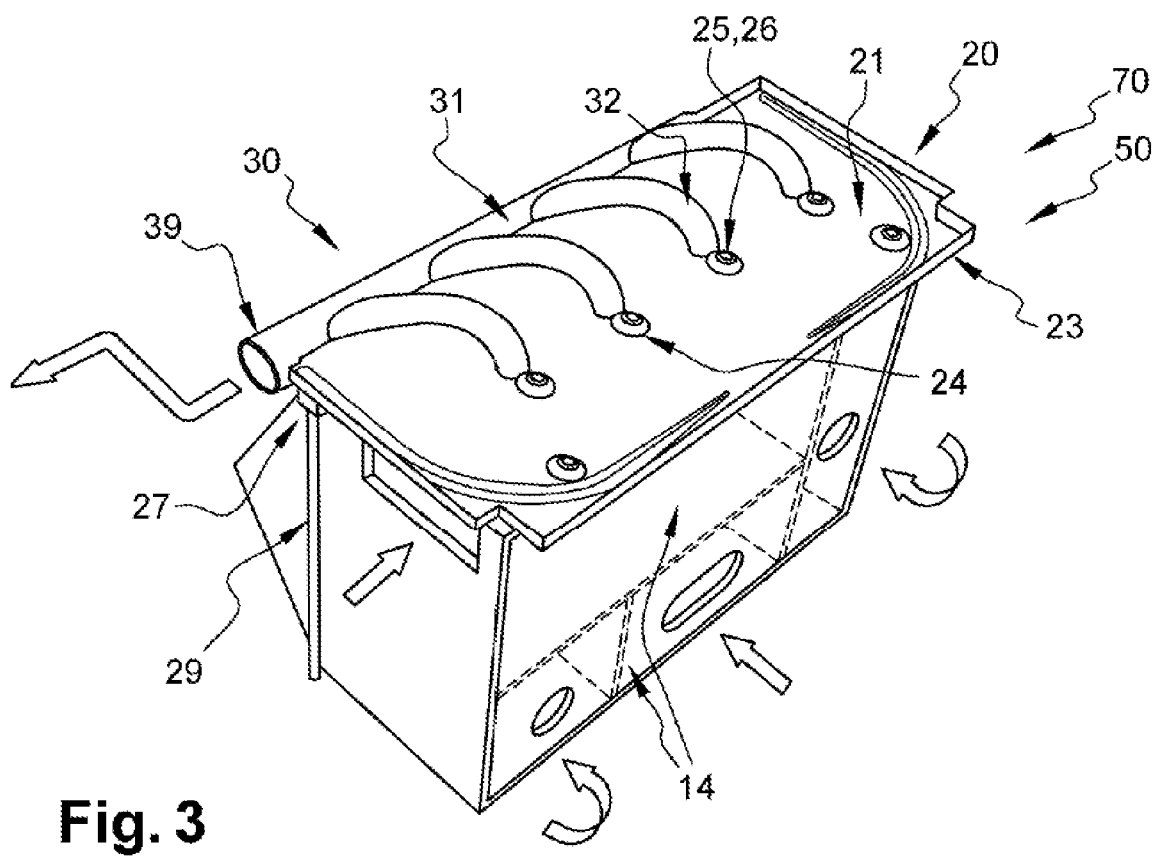
FIG. 3 shows a top perspective view of the same preferred embodiment.

FIGS. 2 and 3 show an electrical cabinet 10 provided with a protection device 70 according to a preferred embodiment of the invention. The electrical cabinet 10 itself is essentially of the same type as the one described hereinabove in the introductory part, in other words, the latter is divided into several compartments 14 housing components, and the upper portion thereof has air-circulation openings 18 connected to these compartments 14.

However, the arrangement of the rain guard 20 and of the manifold 30 on the cabinet 10 differs from the prior art in that the latter are carried out in a single piece, in other words forming an integral unit 50. This unit is formed from the same piece, for example by means of a moulding or by additive printing. The integral unit 50 is advantageously made from a thermoplastic material, but can alternatively be made from other materials. Preferably, it is substantially rigid. Note that the integral unit 50 is not part of the cabinet 10 per se. It is independent from the latter and must be considered rather as an added part to protect the cabinet 10.

The rain guard 20 comprises a panel 21 of substantially flat and rectangular shape. It is designed to cover a section of the cabinet 10, all of it in the case shown. Generally, the integral unit 50 is mounted on the upper wall 11 of the cabinet 10, leaving a small separation between the panel 21 of the rain guard 20 and the upper wall 11. Thanks to this rain guard, the drops and streams of water fall on the rain guard 20, and not on the cabinet 10 itself.

A drain 27 is provided on the panel to serve as a means for evacuating water. The drain comprises an outlet 28 located on a low point of the panel, which will preferably be the lowest point of the upper surface of the panel 21, once the integral unit 50 is installed. The drain 27 is adapted to receive a duct 29, for example a flexible tube, to evacuate the water passing through the outlet 28 to a suitable evacuation point. Although the contrary can be considered, the duct 29 is not part of the same piece as the integral unit 50. In order to facilitate the evacuation of water, grooves, ribs and/or peripheral walls 23 can be provided on the panel 21 to guide the water to the drain 27. In this way, the integral unit 50 effectively protects the cabinet and its components, from condensation/streaming.

The panel 21 comprises several bosses 24 at its upper surface. These bosses 24 are used as fastening points for the panel, and each comprise a hole 26 to receive a screw 25. Protruding from the upper surface of the panel 21, these bosses 24 are designed to prevent water from accumulating around the hole 26 and from penetrating therein. The fastening points are provided in the vicinity of the pipes 32 of the manifold 30, as well as in certain corners of the panel 21. In this embodiment, certain screws 25 are directly fastened on the cabinet 10, while other screws 25, in the vicinity of the pipes 32, are indirectly fastened to the cabinet 10 via collars 40 fastened to the cabinet 10, disclosed in detail hereinbelow.

The manifold 30 is, generally, of a form similar to a combustion gas manifold of a vehicle motor. It comprises, on the cabinet side, an assembly of first pipes 32, fluidically connected to a second pipe 31, preferably of a diameter wider than that of the first pipes 32. The proximal ends 38 of the first pipes 32 are connected to the electrical cabinet 10, while their distal ends 37 are connected to the second pipe 31. However, the distal end 39 of the second pipe 31 is connected to an air-circulation means (not shown). In its simplest form, the manifold 30 can comprise a single pipe (comprised of a first pipe attached to a second pipe).

In the embodiment shown, the manifold 30 comprises four first pipes 32 which are attached together as a single second pipe 31. More precisely, the proximal ends 38 of the first pipes 32 protrude from the lower surface of the flat panel 21 essentially perpendicularly to the panel 21. Then, these first pipes 32 continue by forming an arc exiting from the upper surface of the panel 21, to a longitudinal edge of the panel, where they join the second pipe 31, extending along this longitudinal edge. The second pipe 31 is located for one part above the panel 21 and a part below.

The first pipes 32 of the manifold 30 are connected to the air-circulation openings 18 of the compartments 14, and therefore are fluidically connected with the inside of the cabinet 10. Typically, each first pipe 32 (and therefore each associated circulation opening 18) serves a compartment 14 inside the cabinet 10, with its dimensions being chosen according to the size of the compartment 14 and its needs to be cooled. The second pipe 31 of the manifold 30 is fluidically connected with a pump-64 (not shown) acting as the air-circulation means. The hot air in the compartments inside the cabinet 10 can therefore be extracted by the pump, thus cooling the components in the cabinet 10.

Substantially, the fact that the first pipes 32 of the integral unit 50 pass through the panel 21, allows the latter to be located lower than the top of the manifold 30, which makes it possible to save space, especially in terms of height. Of course, the second pipe 31 of the manifold 30 can also pass through the panel 21 if necessary. Also substantially, the fact that the rain guard 20 and the manifold 30 are integrated into a unit 50, also participates in reducing the number of parts and facilitates the installation.

However, it can be considered that the integral unit 50 of the protection device 70 has other forms. For example, the rain guard 20 can cover only a top portion of the cabinet 10 and not all of it, be of circular shape, with a different drain disposition, etc. Also, the manifold 30 can comprise pipes disposed differently, or a different number of pipes. It will be understood that the distribution of the pipes, as well as the division of the inside of the electrical cabinet 10 is a design choice of those skilled in the art. Various configurations could be considered by those skilled in the art without leaving the scope of the present invention.

Figure 4:
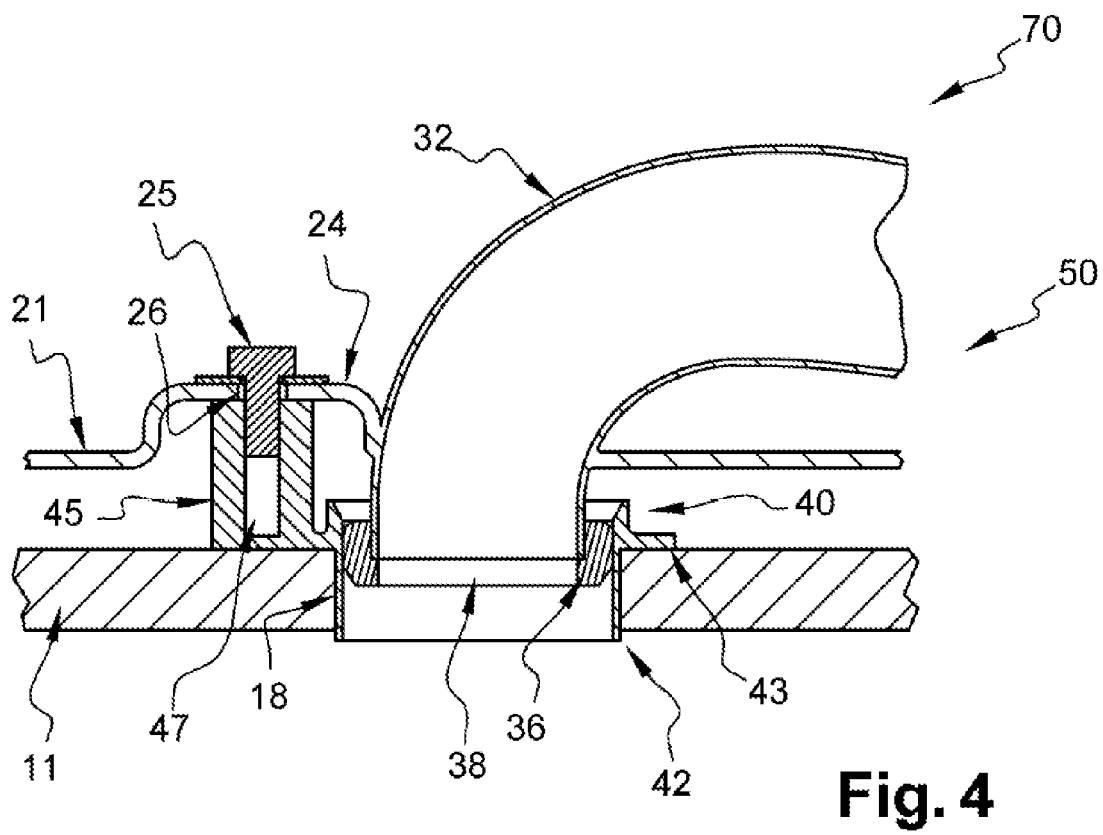
FIG. 4 shows a cross-section view of the connection of the manifold to the cabinet of the same preferred embodiment.

FIG. 4 shows in detail the connection between the manifold 30 and the cabinet 10 according to the preferred embodiment. Collars 40, corresponding to the number of air-circulation openings 18 on the cabinet 10, make it possible to connect the proximal ends 38 of the first pipes 32 to the air-circulation openings 18. Here, the collars 40 comprise a tubular sleeve 42 as well as a circular flange 43 extending perpendicularly to the sleeve 42.

The collars 40 are fastened to the cabinet 10 by inserting the sleeve 42 into the air-circulation opening 18, then by fastening the circular flange 43 against the upper wall 11 of the cabinet 10, by screws and/or by gluing. The collars 40 are provided with a support or foot 45 to support the integral unit 50, while still guaranteeing a separation with the top of the cabinet 10. Of course, for even more stability, the panel 21 can also be provided with feet on its lower surface. These feet then comprise a threaded hole 47 to receive a screw 25. The screws 25 are received in the threaded holes 47 to fasten the integral unit 50 on the cabinet 10.

Sealing rings 36 with an annular shape are disposed at the respective proximal ends 38 of the first pipes 32. When the end 38 of the first pipe 32 of the manifold 30 is in place in the sleeve 42 of the collar 40, the sealing ring 36 is interposed between the proximal end 38 of the first pipe 32 and the sleeve 42. The sealing ring 36 does not substantially render the connection sealed but also makes it possible to dampen the vibrations. Note that the sealing rings 36 are not mandatory, for example the first pipes 32 can be provided with bulging endings directly in contact with the inside of the sleeve 42.

Of course, other types of connection between the first pipes 32 and the cabinet 10 can be considered. For example, it is not essential for the exterior of the sleeve 42 to correspond to the diameter of the air-circulation opening 18. It can be designed with a smaller diameter, to receive a first pipe 32 of the manifold 30, also of a smaller diameter, in order to manage the flow rate of air in a specific compartment 14. Instead of several independent collars 40, a sole integrated several collars can be used in order to guarantee the tolerances with the cabinet 10 and the manifold 30.

A practical way to install the protection device 70 on the electrical cabinet 10 will be described hereinbelow. Firstly, the electrical cabinet 10 is prepared beforehand by fastening the collars 40 on its air-circulation openings 18, and by closing off each air opening 18, more precisely each sleeve 42, by means of a cover. At the same time, the integral unit 50, comprised of a single piece, is prepared by installing the sealing rings 36 on the proximal ends 38 of the first pipes 32.

Once the cabinet 10 is set in place at the desired position, the covers are removed in order to open the air-circulation openings 18. Then the integral unit 50, which, recall is a relatively rigid unit, is positioned above the cabinet 10 with the first pipes 32 oriented downwards, then lowered to insert each of the proximal ends 38 provided with its sealing ring 36 into the sleeve 42 of a corresponding collar 40, until the integral unit 50 is resting on its feet 45.

At this stage, the rain guard 20 covers the entire cabinet 10, and the manifold 30 is fluidically connected with the compartments 14. The screws 25 are then inserted into the holes 26 to fasten the integral unit 50 to the cabinet 10. The tube 29 of the drain 27 is then connected to the outlet 28 of the panel 21. Finally, the distal end 39 of the second pipe 31 is fluidically connected to a pump-64. In the operating mode of the cabinet, water from condensation/streaming will fall on the rain guard 20 and will be evacuated, while the hot air in the cabinet 10 will be extracted by the pump-64, thus protecting the cabinet 10 and its components.

This protection device 70 is clearly better than that of prior art. Substantially, the rain guard 20 is located lower than the top of the manifold 30, which already saves space in terms of height. Furthermore, the integral unit 50 being of a single piece greatly facilitates the installation thereof.

The invention has been disclosed with respect to a cabinet 10 divided into several compartments 14 from which the hot air is extracted. However, it is understood that the cabinet 10 can be divided differently, comprising a single or more compartments, and according to the size of the latter, one or more pipes can be connected to each compartment. Furthermore, instead of extracting the hot air, a pump for introducing cold air inside the cabinet could alternatively be used. The air manifold will then be an intake manifold instead of being an exhaust manifold.

The protection device of the invention 70 can easily be retrofitted to cabinets that are already equipped with a rain guard and with a manifold (independent), already installed that exist in the aircraft. However, the invention is not limited to electrical cabinets that equip an aircraft, and can be used in vessels, buildings, etc.

What is claimed is:

1. Protection device for an electrical cabinet comprising a rain guard and an air manifold formed as an integral unit, the rain guard comprising a panel adapted to cover a section of an electrical cabinet, and the air manifold comprising at least one first pipe fluidically connected, at a distal end, to a second pipe, each of the at least one first pipe adapted to be connected, at its proximal end, to an air-circulation opening of the electrical cabinet, and the second pipe adapted to be connected, to an air-circulation means, wherein each of the at least one first pipe passes through the panel.

2. The protection device according to claim 1, wherein the integral unit is carried out by moulding or by additive printing.

3. The protection device according to claim 1, further comprising at least one collar arranged to connect each of the at least one first pipe to the corresponding air-circulation opening.

4. The protection device according to claim 3, wherein the at least one collar comprises a sleeve to receive the at least one first pipe and a flange around the sleeve arranged to be fastened on top of the electrical cabinet facing the air-circulation opening.

5. The protection device according to claim 4, wherein each of the at least one first pipe is provided with a sealing ring at its proximal end, intended for being interposed between the at least one first pipe and the at least one collar.

6. The protection device according to claim 5, wherein the panel includes bosses each comprising a hole to receive a screw to fasten the integral unit to the electrical cabinet.

7. Electrical cabinet provided with a protection device according to claim 1, the electrical cabinet being divided into a plurality of compartments and each of the plurality of compartments comprising the air-circulation opening, and the protection device being mounted on top of the electrical cabinet, the panel of the rain guard covering at least one section of the electrical cabinet, and the at least one first pipes being connected respectively to the air-circulation openings of said compartments and the second pipe being fluidically connected to the air-circulation means.

* * * * *